United States Patent [19]

Gunning

[11] Patent Number: 5,023,488

[45] Date of Patent: Jun. 11, 1991

[54] DRIVERS AND RECEIVERS FOR INTERFACING VLSI CMOS CIRCUITS TO TRANSMISSION LINES

[75] Inventor: William F. Gunning, Los Altos Hills, Calif.

[73] Assignee: Xerox Corporation, Stamford, Conn.

[21] Appl. No.: 502,372

[22] Filed: Mar. 30, 1990

[51] Int. Cl.[5] ............................................. H03K 5/09
[52] U.S. Cl. .................................. 307/475; 307/443; 307/451; 307/362
[58] Field of Search ................ 307/475, 443, 451, 362

[56] References Cited

U.S. PATENT DOCUMENTS 4,486,753 12/1984 Saeki et al. ........................... 307/475
4,779,015 10/1988 Erdelyi ................................. 307/475
4,859,877 8/1989 Cooperman et al. ................ 307/443

Primary Examiner—Stanley D. Miller
Assistant Examiner—Scott A. Ouellette

[57] ABSTRACT

This invention provides very wide channel, open drain, N-channel CMOS drivers and cascode CMOS receivers for interfacing VLSI CMOS circuits to transmission lines which are terminated by their characteristic resistive impedances to voltage levels on the order of about 1.2 v–2.0 v. These GTL (a coined descriptor) drivers and receivers typically operate with a voltage swing on the order of about 0.8 v–1.4 v on such transmission lines for carrying out binary communications between CMOS circuits configured to operate with standard 5 v rail-to-rail voltage swings for their internal signals.

5 Claims, 4 Drawing Sheets

DRIVERS AND RECEIVERS FOR INTERFACING VLSI CMOS CIRCUITS TO TRANSMISSION LINES

FIELD OF THE INVENTION

This invention relates to drivers and receivers for interfacing CMOS (complementary metal oxide semiconductor) digital circuits to transmission lines and, more particularly, to relatively low power drivers and relatively sensitive receivers for interfacing VLSI (very large scale integrated) CMOS circuits to relatively low impedance, terminated transmission lines.

BACKGROUND OF THE INVENTION

Digital computers and the like often include a plurality of VLSI circuits which are interconnected for binary communications by single segment or multi-segment transmission lines (collectively referred to herein as "transmission lines," but see a copending and commonly assigned Bruce et al. United States patent application which was filed Mar. 6, 1990 under Ser. No. 07/490,113 on "A Multi-Segmented Bus and Method of Operation" for a description of a computer bus composed of segmented, balanced transmission lines). Drivers and receivers interface the VLSI components of such systems to the transmission lines. The transmission lines, in turn, conventionally are traces which are formed on a suitable substrate, such as a PCB (printer circuit board). For example, so-called microstrip traces and strip line traces can be employed to form transmission lines having characteristics impedances on the order of about 50Ω–70Ω. Moreover, in keeping with standard practices, such transmission lines may have their opposite ends terminated in their characteristic impedance. Thus, the output load on a driver for such a transmission line may be as low as 25Ω–35Ω or so (i.e., the effective resistance of the parallel resistive terminations for the transmission line).

The power $P_i$, dissipated internally of the driver is given by:

$$P_i = vi \tag{1}$$

where:
v = the voltage dropped across the driver; and
i = the current drawn by the driver To a first approximation, a binary driver functions as an open (non-conductive) or closed (conductive switch), so equation (1) can be rewritten to describe the power the driver internally dissipates when it is driving a terminated transmission line as:

$$P_i = \frac{v_i(v_t - v_i)}{R_L} \tag{2}$$

where:
$v_i$ = the voltage dropped across the driver when it is conducting;
$v_t$ = the voltage level to which the transmission line is terminated; and
$R_L$ = the effective load impedance provided by the transmission line.

Thus, it will be evident that the power internally dissipated by the driver is proportional to the nominal voltage swing ($v_t - v_i$) of the binary signal it applies to the transmission line and to the nominal low voltage limit of that signal (i.e., the logical "0" level).

As is known, CMOS technology is attractive for fabricating VLSI circuits having relatively high gate densities, but the nominal 5 v rail-to-rail voltage swing (nominally, 0 v–5 v) of standard CMOS circuits tends to cause the output drivers for such circuits to dissipate excessive amounts of power internally whenever the drivers are working into low impedance loads, such as terminated transmission lines of the above-described type. In recognition of that, others have proposed voltage buffering drivers and voltage translating receivers for interfacing CMOS circuits to such transmission lines. More particularly, proposals have been made for carrying out the binary communications between such circuits at TTL (transistor-transistor logic) signal levels (nominally 0 v–3.5 v), at PECL (positive emitter coupled logic) signal levels (nominally, 3.2 v–4.2 v), and at BTL (backplane transistor logic) signal levels (nominally, 1.1 v–2.0 v). From a power dissipation point of view, PECL and BTL signaling are superior to TTL signaling. However, PECL and BTL signaling are relatively difficult to implement in CMOS (indeed, the known BTL implementations are BiCMOS specific). TTL signaling is somewhat easier to implement in CMOS, but it provides only a modest improvement over rail-to-rail CMOS signaling from a power dissipation standpoint.

It, therefore, will be apparent that there is an urgent need for relatively low power drivers and for compatible receivers which can be economically and reliably implemented in existing CMOS technology for interfacing VLSI CMOS circuits to relatively low impedance terminated transmission lines.

SUMMARY OF THE INVENTION

In response to the above-identified need, this invention provides very wide channel, open drain, N-channel CMOS drivers and cascode CMOS receivers for interfacing VLSI CMOS circuits to transmission lines which are terminated by their characteristic resistive impedances to voltage levels on the order of about 1.2 v–2.0 v. These GTL (a coined descriptor) drivers and receivers operate with a voltage swing on the order of about 0.8 v–1.4 v on such transmission lines for carrying out binary communications between CMOS circuits configured to operate with standard 5 v rail-to-rail voltage swings for their internal signals.

In keeping with one of the more detailed features of this invention, provision advantageously is made in a GTL driver for briefly clamping its drain to its source when it is being switched from a conductive state to a non-conductive state, thereby reducing the rate at which the current drawn by the driver changes so as to provide increased damping for the voltage overshoot (sometimes referred to as "backswing") and for the ground bounce which tend to occur on the low-to-high transitions of the binary signal because of the inductance and capacitance in the drain and source circuitry, respectively, of the driver. Furthermore, in accordance with still another feature of this invention, the receiver advantageously has a differential configuration for stabilizing its decision threshold from implementation-to-implementation, despite CMOS process variations in those implementations.

BRIEF DESCRIPTION OF THE DRAWINGS

Still further objects and advantages of the present invention will become apparent when the following detailed description is read in conjunction with the attached drawings, in which.

DETAILED DESCRIPTION OF THE ILLUSTRATED EMBODIMENTS

Figure 1:
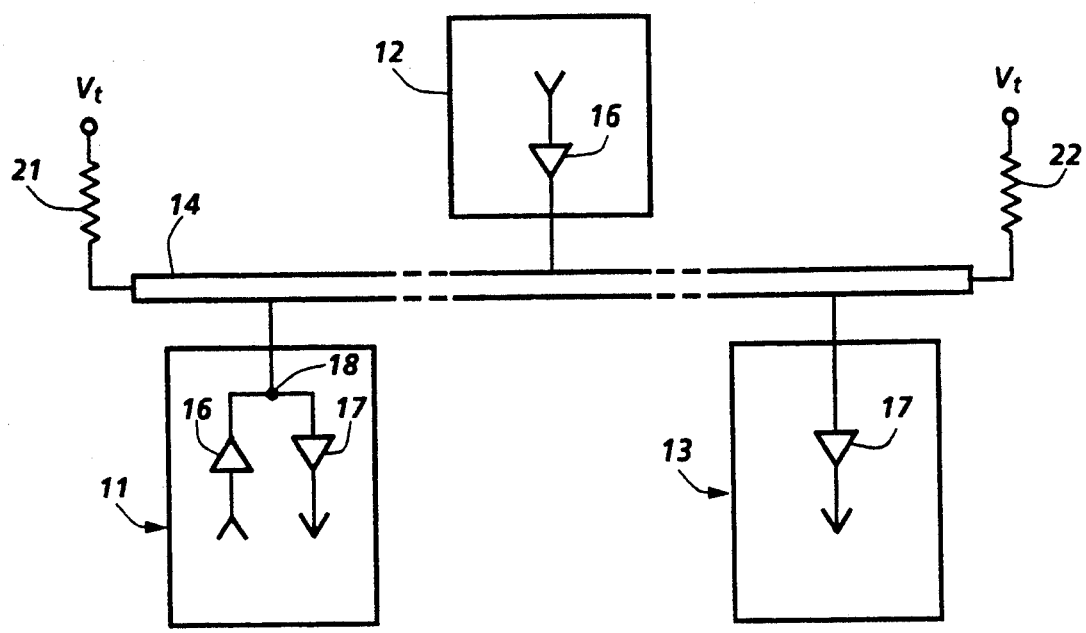
FIG. 1 is a simplified schematic diagram of a set of VLSI CMOS circuits which are interfaced to a transmission line.

While the invention is described in some detail hereinbelow with reference to certain illustrated embodiments, it is to be understood that there is no intent to limit it to those embodiments. On the contrary, the intent is to cover all modifications, alternatives and equivalents as may fall within the spirit and scope of the invention as defined by the appended claims. It also should be noted that like reference numerals are used to identify like parts throughout this description.

Turning now to the drawings, and at this point especially to FIG. 1, it will be seen that there are a plurality of VLSI CMOS circuits 11-13 (shown only in relevant part) which are interfaced to a transmission line 14 for binary communications. The circuits 11-13 typically are functionally interrelated members of a "chip set" for, say, a digital computer (not shown). Accordingly, in practice, the transmission line 14 may be one of several generally similar conductive traces which are formed on a suitable substrate, such as a PCB (also not shown), to form an N-bit wide bus, where N is determined by the computer architecture.

As will be appreciated, the interfaces between the circuits 11-13 and the transmission line 14 may take various forms in an environment of the foregoing type. Some of them may be configured to function as tranceivers, so they have a driver 16 and a receiver 17 which are coupled to the transmission line 14 via a shared or common node 18 (see the interface shown for the circuit 11), others may have merely a driver 16 for a transmit only mode of operation (see the interface shown for the circuit 12), and still others may have merely a receiver 17 for a receive only mode of operation (see the interface shown for the circuit 13). While each of the circuits 11-13 is illustrated as having only one interface, it will be understood that they each usually include several interfaces, some of which may be bidirectional and others of which may be unidirectional.

Figure 2:
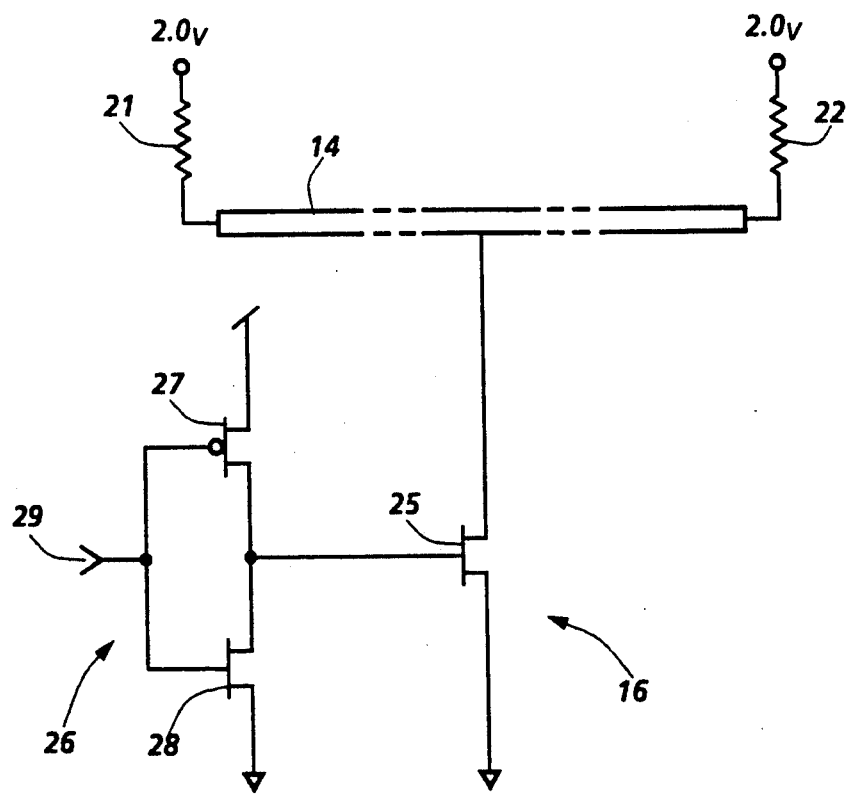
FIG. 2 is a simplified circuit diagram of a basic GTL driver.

Referring to FIG. 2, the GTL drivers and receivers that are provided by this invention are employed for carrying out binary communications over relatively low impedance transmission lines which are terminated to voltage levels on the order of about 1.2 v-2.0 v. As previously pointed out, the transmission line 14 typically is a microstrip trace or a strip line trace with a characteristic resistance on the order of about 50Ω-70Ω, so it is shown in this instance as having its opposite ends terminated to a regulated voltage level of 2.0 v by resistors 21 and 22 which have values selected to match its characteristic impedance. This means that the driver 16 works into a load of roughly 25Ω-35Ω (i.e., the effective resistance of the parallel terminating resistors 21 and 22). Other drivers generally are connected to the transmission line 14 (see FIG. 1), but only one driver is granted control over the transmission line 14 at any given time. In keeping with one of the detailed aspects of this invention, advantage is taken of the small feature sizes (2.0 μm and less) which can be realized in modern CMOS technology to ensure that the drivers 16 do not cause significant capacitive loading of the transmission line 14 when they are inactive.

In accordance with the present invention, each of the drivers 16 comprises a very wide channel, open drain, N-channel CMOS transistor 25 for transforming binary signals to the transmission line 14 from a more or less conventional CMOS signal source 26 (shown only in relevant part) and for effectively isolating the transmission line 14 from the ordinary 5 v rail-to-rail signal swing of the signal source 26. To carry out those functions, the transistor 25 has its gate connected to the output of the signal source 26, its drain connected to the transmission line 14, and its source returned to ground (i.e., the same reference level as the 0 v rail of the signal source 26). Although only a single transistor 25 is shown, it is to be understood that it may be fabricated by connecting any number of N-channel transistors in parallel with each other because such parallelism may be a necessary or desirable expedient in some situations for producing a transistor 25 of the desired effective channel width, as more fully described hereinbelow.

As will be appreciated, the rate at which the transistor 25 responds to transitions in the binary signal supplied by the signal source 26 is dependent upon the rate at which its gate capacitance charges and discharges, respectively. Therefore, for higher frequency operations, the output stage of the signal source 26 advantageously is an inverter comprising a P-channel transistor 27 and an N-channel transistor 28. The transistors 27 and 28 are connected in a standard inverter configuration. More particularly, they have their gates connected in parallel to a signal node 29 within the signal source 26, their drains connected in parallel to the gate of the transistor 25, and their sources connected to the 5 v rail and the 0 v rail, respectively, of signal source 26.

In operation, when the signal at the node 29 drops to a low ("0") logic level, the transistors 27 and 28 are switched into and out of conduction, respectively. Thus, the gate capacitance of the transistor 25 is charged relatively rapidly by the current flowing through the source-drain circuit of the transistor 27. That quickly pulls the gate of the transistor 25 up toward the 5 v rail of the signal source 26, thereby causing the transistor 25 to promptly switch into conduction. On the other hand, when the signal at the node 29 increases to a high ("1") logic level, the transistor 27 switches out of conduction while the transistor 28 switches into conduction. This causes the gate capacitance of the transistor 25 to be quickly discharged by the current drawn through the source-drain circuit of the transistor 28, so the gate of the transistor 25 is pulled down relatively rapidly toward the 0 v rail of the signal source 26, thereby promptly switching the transistor 25 out of conduction. As described in additional detail hereinafter, provision may be made for more precisely controlling the output rise times and fall times of the driver 16, but it will be evident at this point that the driver 16 is well suited for driving the transmission line 14 at relatively high frequencies (i.e., frequencies of up to 70 MHz or so are realistic at the current state of the art).

Focusing now on the manner in which the driver 16 drives the transmission line 14, it will be understood that the signal level on the transmission line 14 tends to stabilize substantially at the voltage level to which the transmission line 14 is terminated (2.0 v in this particular embodiment) a short time after the transistor 25 is switched out of conduction (i.e., as soon as the switching transients have settled out). On the other hand, when the transistor 25 is switched into conduction, its source-drain circuit provides a ground return path for current flow through the terminating resistors 21 and 22. Accordingly, the single level at which the transmission line 14 then tends to stabilize (again, after the switching transients have settled out) is determined by the voltage division which the parallel terminating resistor 21 and 22 and the source-drain resistance of the conductive transistor 25 perform on the voltage to which the transmission line 14 is terminated. The effective voltage dividing ratio of the divider is determined to a first approximation by the ratio of the source-drain resistance of the transistor 25 in its conductive state to the sum of that resistance plus the effective resistance of the parallel terminating resistors 21 and 22. Thus, for example, if the low ("0") signal level on the transmission line is selected to be approximately 0.6 v to provide a signal swing of about 1.4 v, the channel width of the transistor 25 ordinarily has to be orders of magnitude greater than its channel length to reduce the effective resistance of its source-drain circuit in conduction to a suitably low level. The optimal channel width-to-channel length ratio for the transistor 25 depends on several process and application specific variables, but a ratio of about 1000:1 is typical at the current state of the art.

Figure 3:
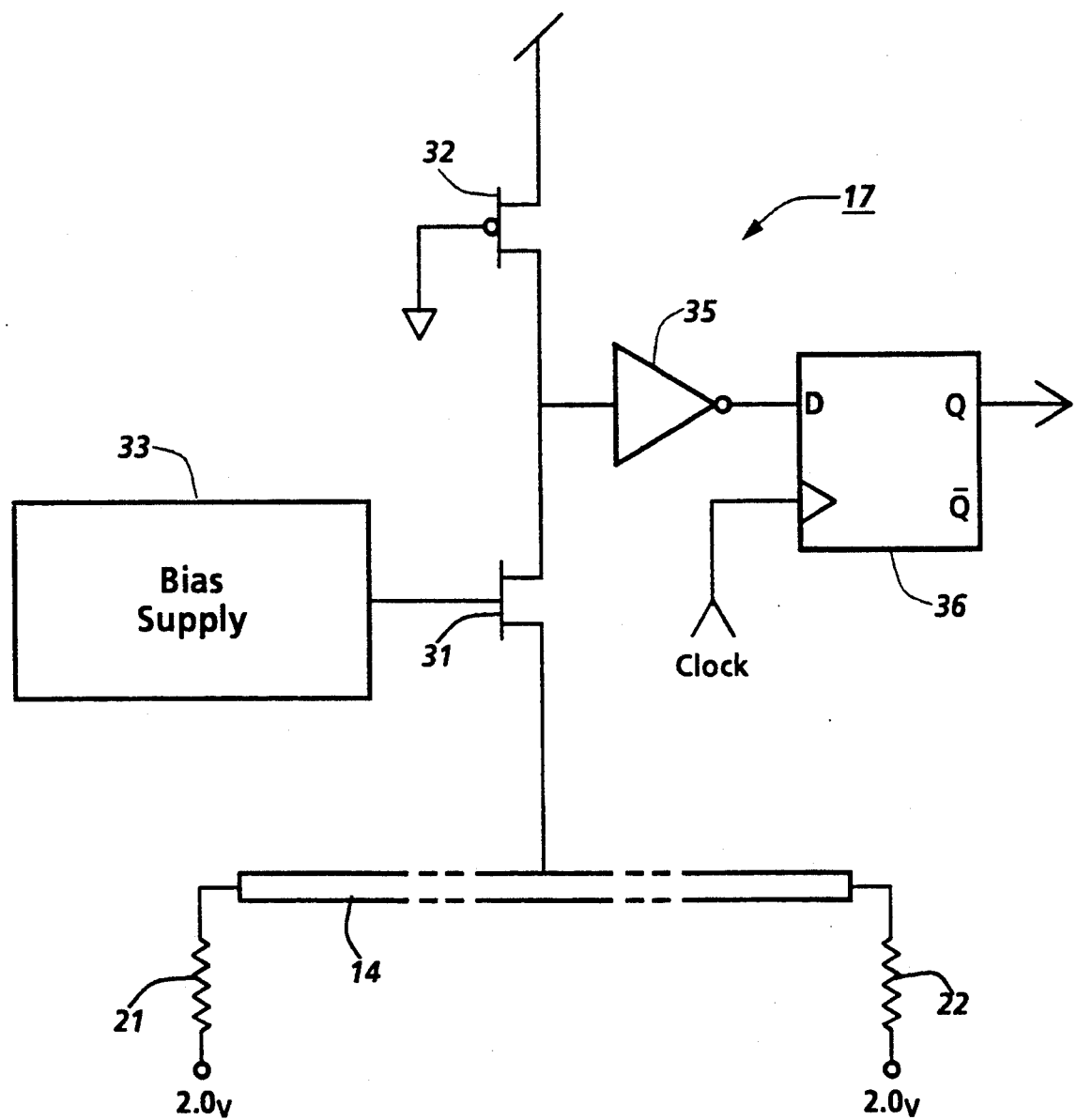
FIG. 3 is a simplified circuit diagram of a basic GTL receiver.

Referring to FIG. 3, it will be seen that the receiver 17 suitably comprises a threshold detector for reliably recovering GTL signals from the transmission line 14, even when those signals are distorted by significant amounts of noise. To that end, the receiver 17 is biased to have a nominal decision threshold at approximately the midpoint of the nominal GTL signal swing (e.g., a threshold of about 1.3 v in this particular case), but it also characteristically has a narrow uncertainty region (typically on the order of about 0.1 v) on both sides of this threshold. Signal swings on one side or the other of this uncertainty region have no effect on the binary level of the signal recovered by the receiver, so such "noise" effectively is filtered out. This uncertainty region is a region of ambiguity, so it desirably is very narrow. Once, however, the signal on the transmission line 14 passes through this uncertainty region, the binary state of the signal the receiver recovers changes predictably.

More particularly, as shown, the receiver 17 includes a relatively high speed cascode threshold detector comprising an N-channel transistor 31 and a P-channel transistor 32. The transistor 31 has its source connected to the transmission line 14, its gate connected to a bias supply 33 and its drain connected to the drain of the transistor 32 which, in turn, has its source connected to a 5 v rail and its gate returned to ground (i.e., connected to a 0 v rail). The bias supply 33 applies a bias voltage to the gate of the transistor 31 which causes it to switch into and out of conduction as the GTL signal on the transmission line 14 swings downwardly and upwardly, respectively, through the midpoint of its nominal swing (i.e., the nominal decision threshold). However, the source-drain current for the transistor 31 is drawn through the source-drain circuit of the transistor 32, so the voltage on their drains tends to increase and decrease as the voltage level of the GTL input signal swings upwardly and downwardly through the decision threshold. An inverter 35 amplifies the voltage on the drains of the transistors 31 and 32 to prepare an edge driven D-type flip-flop 36 to toggle its Q output to high ("1") and low ("0") CMOS logic levels on the lead edge of the next clock pulse when the GTL input signal rises above about 1.4 v and drops below about 1.2 v, respectively.

Figure 4:
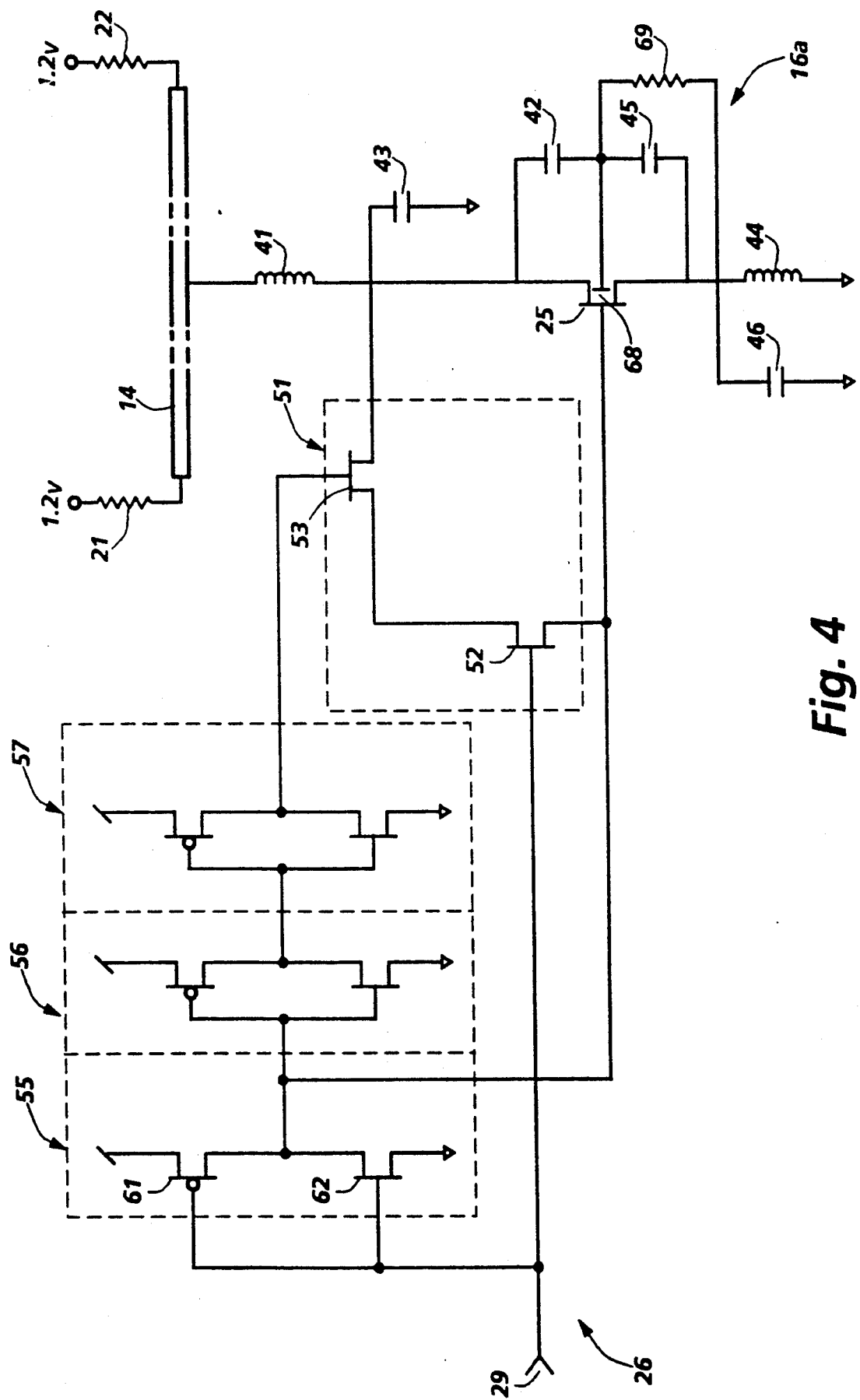
FIG. 4 is a simplified circuit diagram of a more advanced GTL driver.

Various modifications and improvements may be made to the driver and receiver without departing from the present invention. For example, as shown in FIG. 4, provision may be made in the driver for damping certain of the switching transients which are generated when the transistor 25 is switched into and out of conduction. These improvements and the improvements that are described hereinbelow for the receiver permit the GTL signal swing to be reduced to a swing of about 0.8 v between an upper limit of approximately 1.2 v and a lower limit of about 0.4 v.

Some of the more troublesome switching transients occur when the transistor 25 is switched from a conductive state to a non-conductive state. The drain-side parasitic packaging inductance 41 and the drain-side parasitic capacitance 42 and 43 of the transistor 25 form a ringing circuit which tends to cause the voltage on the transmission line 14 to overshoot its nominal upper limit by a substantial margin and to oscillate for a prolonged period of time. Similarly, the source-side parasitic packaging inductance 44 and the source-side parasitic capacitance 45 and 46 of the transistor 25 form another ringing circuit which tends to cause a potentially troublesome oscillatory "ground bounce" perturbance of the reference voltage on the 0 v rail of the host CMOS circuit. Therefore, to reduce these switching transients, the driver 16a advantageously is equipped with a feedback circuit 51 for briefly connecting the drain of the transistor 25 to its gate when the transistor 25 is switched from a conductive state to a non-conductive state. The feedback circuit 51 suitably includes a pair of N-channel transistors 52 and 53 which have their source-drain circuits connected in series between the drain and gate of the transistor 25. The input node 29 for the driver 16a is coupled to the gate of the transistor 52, but there is an asymmetric inverter stage 55 between the node 29 and the gate of the transistor 25, and two additional inverter stages 56 and 57 between the inverter 55 and the gate of transistor 53.

In operation, a low ("0") logic level signal at the input node 29 holds the transistor 52 in a non-conductive state and the transistors 25 and 53 in conductive states. However, shortly after the logic level of the signal at the node 29 increases to a high ("1") logic level, the P-channel transistor 61 and the N-channel transistor 62 of the asymmetric inverter stage 55 switch out of and into conduction, respectively. The transistor 62 tends to pull the gate of the N-channel transistor 25 down toward ground, but the transistor 52 is now switched into conduction, so it completes a feedback path between the drain and the gate of the transistor 25. The transistor 62 is relatively weak (i.e., it has a significantly higher source-drain resistance than the other transistors), so most of the discharge current for the gate capacitance of the transistor 25 is drawn through the drain-source circuit of the transistor 25 via the transistors 52 and 53. As the gate voltage of the transistor 25 drops, its drain voltage increases. However, the feedback path provided by the transistors 52 and 53 precludes the drain voltage of the transistor 25 from increasing to a level significantly above its gate voltage. This limits the rate at which the current flowing through the parasetic inductances 41 and 44 changes, thereby limiting the rates at which the drain-side capacitances 42 and 43, the source-side capacitances 45 and 46, and the gate-substrate capacitance 68 discharge (as will be seen, the capacitance 68 discharges to the source-side of the transistor 25 via a substrate resistance 69). Accordingly, the drain-side voltage overshoot and the source-side ground bounce are damped. Finally, about one nanosecond after the transistor 52 is switched into conduction, the output of the last inverter stage 57 drops to a low ("0") logic level, so the feedback loop then is re-opened to permit the transistor 25 to switch completely out of conduction.

Figure 5:
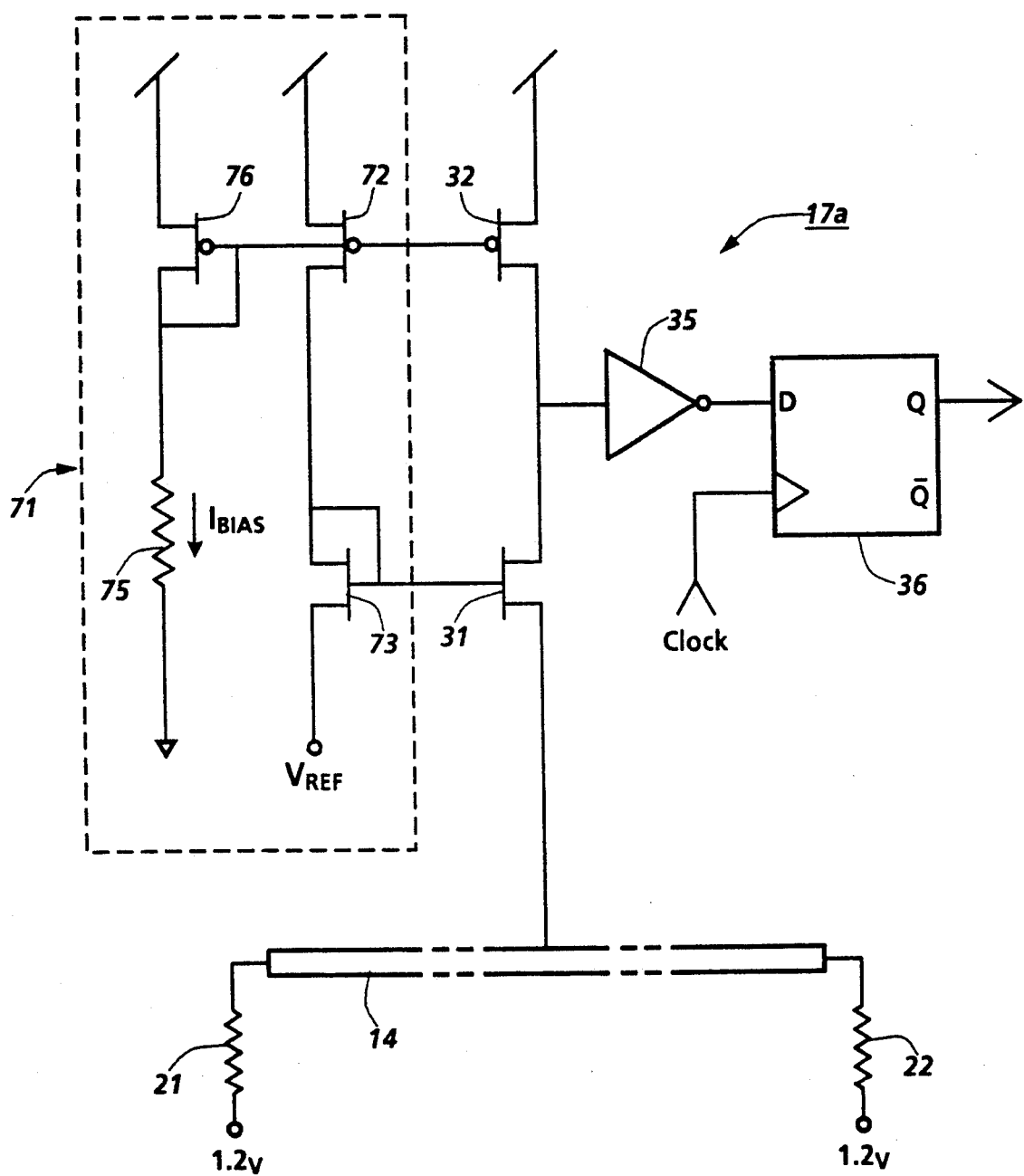
FIG. 5 is a simplified circuit diagram of a more advanced GTL receiver.

Turning now to FIG. 5, it will be seen that the receiver 17a has a bias circuit 71 for reducing its sensitivity to process parameter variations and to perturbances in the ground voltage level, such as may be caused by ground bounce effects. The bias circuit 71 comprises a P-channel transistor 72 and a diode configured N-channel transistor 73 for maintaining a constant bias voltage on the gate of the transistor 31. The transistors 72 and 73 are identical to the transistors 32 and 31, respectively, so any process parameter variations have essentially the same effect on the transistors 72 and 73 as on the transistors 31 and 32.

In operation, the transistors 32 and 72 are biased for conduction by the voltage that is dropped across a substantially constant resistance 75 which draws a fixed bias current, $I_{bias}$, through the source-drain circuit of a diode configured P-channel transistor 76. The transistor 76 is matched to the transistors 32 and 72, so they all are affected in generally the same way by process parameter variations. The gate voltage applied to the transistor 72 causes the transistor 73 to draw a constant current, but the source of the transistor 73 is biased to the nominal decision threshold voltage level (0.8 v in this case), so the gates of the transistors 31 and 73 are held at a voltage level which is substantially equal to the gate-source voltage of the transistor 73 plus the decision threshold voltage level. Given that the transistors 31 and 73 are essentially the same, this means that the transistor 31 switches into and out of conduction almost precisely when the GTL signal level passes through the decision threshold voltage level. As before, the voltage level on the drain of the transistor 31 is amplified by the inverter 35 and then applied to the input of the D-type flip-flop 36, but the Q output of the flip-flop now is prepared to be toggled when the GTL signal on the transmission line drops below approximately 0.7 v and rises above approximately 0.9 v.

CONCLUSION

In view of the foregoing, it will be understood that the present invention provides economical and reliable drivers and receivers for interfacing VLSI CMOS circuits to transmission lines. Moreover, it will be evident that the drivers dissipate relatively little power internally and can be designed to limit the perturbances caused by the parasitic inductance and capacitance of VLSI circuits. The receivers, on the other hand, have the sensitivity and noise immunity that is required for recovering the low voltage, small swing signals that are supplied by the drivers, even when those signals are accompanied by substantial noise.

What is claimed:

1. An interface for interfacing VLSI CMOS binary circuits to a terminated transmission line for binary communications between said circuits at signal levels providing a signal swing of about 0.8 v–1.4 v between a line terminating voltage level of about 1.2 v–2.0 v and a low voltage level of about 0.4 v–0.6 v; said interface comprising
   driver means for feeding binary signals from said CMOS circuits to said transmission line; each of said driver means including an N-channel transistor means having a drain coupled to said transmission line, a source returned to ground, and a gate coupled to receive binary signals from one of said CMOS circuits; the gate of said transistor means being of predetermined effective width and length, with its width being plural orders of magnitude greater than its length.

2. The interface of claim 1 further comprising
   receiver means for feeding binary signals from said transmission line to said CMOS circuits, each of said receiver means including a N-channel transistor, a P-channel transistor, a reference means for supplying a predetermined reference voltage, and a bias means for supplying a predetermined bias voltage; said N-channel transistor having a source coupled to said transmission line, a drain, and a gate coupled to said reference means; said P-channel transistor having a source coupled to a power supply, a drain coupled to the drain of said N-channel transistor, and a gate coupled to said bias means; said bias voltage being selected to bias said P-channel transistor for conduction; and said reference voltage being selected for switching said N-channel transistor into and out of conduction as the signal on said transmission line drops below and rises above, respectively, a predetermined decision threshold near dead center of said signal swing.

3. The interface of claim 2 wherein each of said receiver means further includes
   amplifier means coupled to the drains of said transistors; and
   a flip-flop coupled to said amplifier means, said flip-flop being prepared to switch from one state to another when the signal on said transmission line drops below and rises above, respectively, said decision threshold by a predetermined amount.

4. An interface for interfacing VLSI CMOS binary circuits to a terminated transmission line for binary communications between said circuits at signal levels providing a nominal signal swing of up to about 1.4 v between a line terminating voltage level of up to about 2.0 v and a lower voltage level; said interface comprising
   driver means for feeding binary signals from said CMOS circuits to said transmission line; each of said driver means including an N-channel transistor means having a drain coupled to said transmission line, a source returned to ground, and a gate coupled to receive binary signals from one of said CMOS circuits; the gate of said transistor means being of predetermined effective width and length, with its width being plural orders of magnitude greater than its length.

5. The interface of any of claims 1, 2, 3 or 4 wherein said driver means further includes:

a normally disabled switch means coupled between the source and gate of said N-channel transistor means; and means for enabling said switch means temporarily whenever said transistor means is being switched from a conductive state to a non-conductive state, thereby providing a negative feedback path from the source to the gate of said transistor means for a sufficient period of time to substantially damp switching transients at the source and drain of said transistor means.

* * * * *